United States Patent
Johnson et al.

(10) Patent No.: US 10,757,840 B2
(45) Date of Patent: Aug. 25, 2020

(54) DATA CENTER CORE, SHELL, AND AIRFLOW DESIGN

(71) Applicant: Microsoft Technology Licensing, LLC, Redmond, WA (US)

(72) Inventors: Priscilla Johnson, Washington, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/957,214

(22) Filed: Apr. 19, 2018

(65) Prior Publication Data

US 2019/0335624 A1   Oct. 31, 2019

(51) Int. Cl.
| | |
|---|---|
| *F28C 1/00* | (2006.01) |
| *H05K 7/20* | (2006.01) |
| *H05K 7/14* | (2006.01) |
| *H02K 7/18* | (2006.01) |
| *G05B 19/4155* | (2006.01) |

(52) U.S. Cl.
CPC ..... *H05K 7/20836* (2013.01); *G05B 19/4155* (2013.01); *H02K 7/183* (2013.01); *H05K 7/1488* (2013.01); *H05K 7/2039* (2013.01); *H05K 7/20736* (2013.01); *H05K 7/20781* (2013.01); *G05B 2219/49215* (2013.01)

(58) Field of Classification Search
CPC .................................................... Y10S 261/11
See application file for complete search history.

(56) References Cited

U.S. PATENT DOCUMENTS

| | | | | |
|---|---|---|---|---|
| 5,480,594 A | * | 1/1996 | Wilkerson | F28F 25/10 261/109 |
| 7,864,530 B1 | * | 1/2011 | Hamburgen | H05K 7/20827 165/104.33 |
| 7,961,463 B2 | | 6/2011 | Belady et al. | |
| 8,917,502 B1 | | 12/2014 | Gardner | |
| 9,655,283 B2 | | 5/2017 | James et al. | |

(Continued)

OTHER PUBLICATIONS

"New Design Cooling Tower Fill 305mm/Good efficiency Fill Sheet for Counter-flow Cooling Tower", Retrieved from: <<https://www.alibaba.com/product-detail/New-design-cooling-tower-fill-305mm_60180978571.html>>, Retrieved on: Feb. 26, 2018, 12 Pages.

(Continued)

*Primary Examiner* — Mark A Connolly
(74) *Attorney, Agent, or Firm* — Buckley, Maschoff & Talwalkar LLC

(57) ABSTRACT

According to some embodiments, a system to improve heat transfer for a data center may include a substantially cylindrical data center tower. The data center tower may include a data center tower bottom having at least one bottom opening to receive external air and a data center tower top, smaller than the data center tower bottom, having a top opening to expel air containing heat, created by the data center, via the Venturi effect. A plurality of hydrophilic bladders may be located proximate to at least a portion of a side of the data center tower, and plurality of data center computer servers may be arranged proximate to the side of the data center tower. In some embodiments, a heat capturing bottom portion of the side of the data center tower is formed of transparent material and/or a translucent material.

20 Claims, 14 Drawing Sheets

(56) References Cited

U.S. PATENT DOCUMENTS

| | | |
|---|---|---|
| 2008/0209931 A1 | 9/2008 | Stevens |
| 2017/0003079 A1* | 1/2017 | Sun .......................... F28B 9/06 |
| 2017/0127572 A1 | 5/2017 | Mao et al. |
| 2017/0187592 A1* | 6/2017 | Ghosh ....................... F03D 7/04 |
| 2017/0196126 A1 | 7/2017 | Mao et al. |

OTHER PUBLICATIONS

Deshmukh, Ruddhi, "Data Center Cooling Augmentation Using Microencapsulated Phase Change Material", In Thesis of University of Texas at Arlington, Aug. 2014, 53 Pages.

* cited by examiner

DATA CENTER CORE, SHELL, AND AIRFLOW DESIGN

BACKGROUND

Data center equipment can generate substantial amounts of heat. For example, data center computer servers, server racks, etc. can generate a substantial amount of heat that needs to be removed to maintain temperatures within prescribed limits and ensure that the hardware will continue to function properly. This can be especially true when the data center utilizes high power servers (which generate heat in proportion to higher power). To help move the heat away from such devices, some data centers employ heat sinks, electric fans (which can consume a substantial amount of energy) and water-based cooling equipment that consume substantial amounts of water. In cases of higher power levels liquid cooling circuits and liquid immersion baths (which can be expensive and error-prone), more expensive heat sink solutions, etc. are required.

What is needed is a system to efficiently improve data center cooling without needing expensive additional hardware and extracting unsustainable amounts of freshwater.

DETAILED DESCRIPTION

The following description is provided to enable any person in the art to make and use the described embodiments. Various modifications, however, will remain readily apparent to those in the art.

Generally, some embodiments provide systems and methods to efficiently improve data center. Some embodiments described herein address the problem of airflow in a data center when hot air gets mixed in with cold air and causes the data center to need more energy to cool it down. Some embodiments use environmental forces to perform that task while improving cooling efficiency.

Figure 1A:
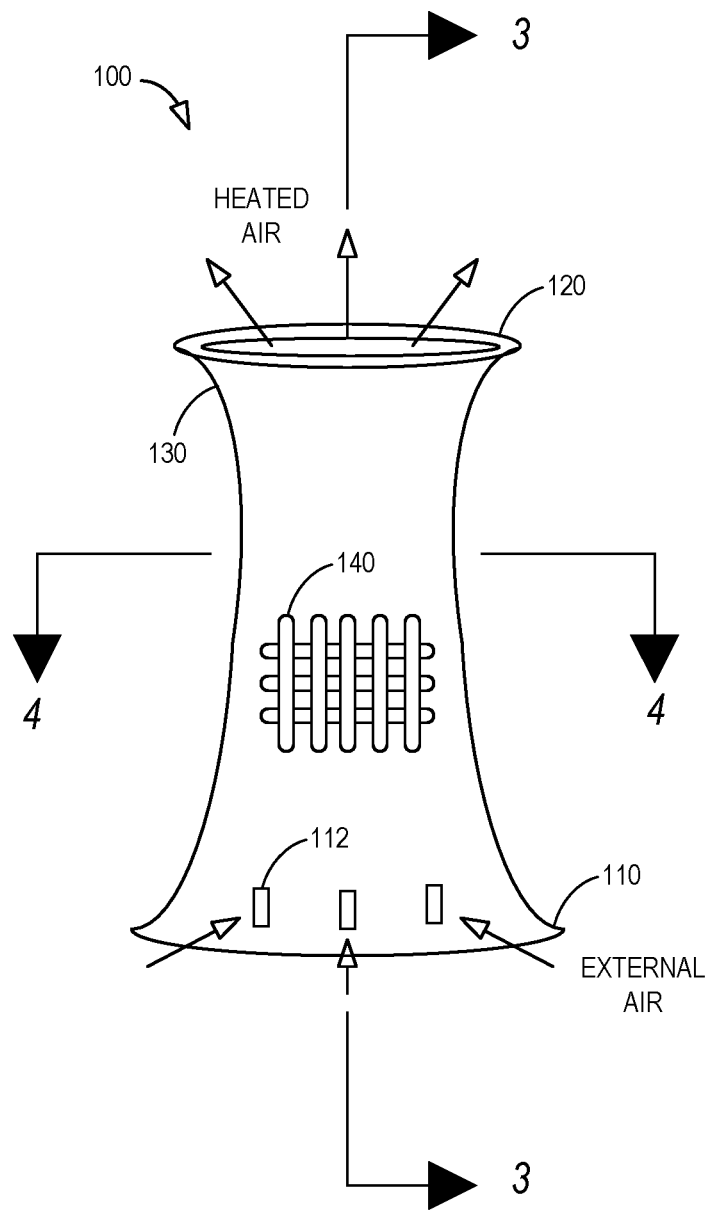
FIG. 1A is a high-level block diagram of a system according to some embodiments.

FIG. 1A is a high-level block diagram of a system 100 according to some embodiments. The system 100 includes a substantially cylindrical data center tower, generally shaped like a tube. The tower includes a data center tower bottom 110 having at least one bottom opening 112 to receive external air. The tower also includes a data center tower top 120, smaller than the data center tower bottom 110, having a top opening to expel air containing heat, created by the data center, via the "Venturi effect." As used herein, the phrase "Venturi effect" may refer to a reduction in fluid pressure that results when a fluid flows through a constricted section of a tube (e.g., the data center tower). According to some embodiments, the side 130 of the data center tower is associated with a concave curve such that the data center tower has a substantially hyperboloid shape. As a result, air velocity may increase as it passes through the constriction in accord with the principle of mass continuity, while its static pressure may decrease in accord with the principle of conservation of mechanical energy. Thus, any gain in kinetic energy the air may accrue due to its increased velocity through a constriction may be balanced by a drop in pressure.

Figure 1B:
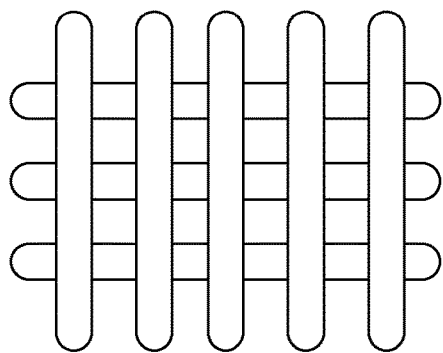
FIGS. 1B through 1D illustrate hydrophilic bladder patterns in accordance with some embodiments.
Figure 1C:
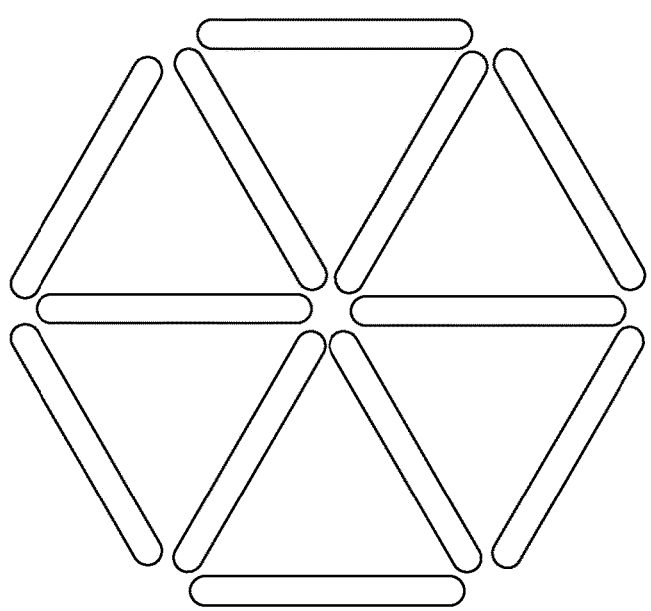
Figure 1D:
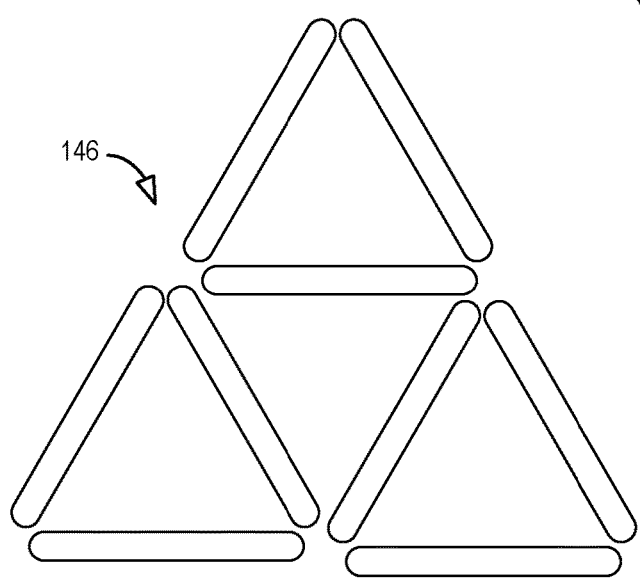

According to some embodiments, a plurality of hydrophilic bladders 140 are located proximate to at least a portion of a side 130 of the data center tower. The bladders 140 may attract and store rain water, condensation, to help reduce the amount of potable water that is consumed by the system 100. Note that the bladders may be arranged in various ways, and FIGS. 1B through 1C illustrate hydrophilic bladder patterns in accordance with some embodiments. In particular, FIG. 1B illustrates a substantially lattice pattern 142, FIG. 1C illustrates a substantially spiderweb pattern 144, and FIG. 1D illustrates a substantially isometric pattern 146.

Referring again to FIG. 1, the system 100 may further include a plurality of data center computer servers arranged proximate to the side 130 of the data center tower (e.g., inside a wall represent the side 130 of the data center tower). In this way, naturally occurring airflow through the tower may expel heat from the system 100 as it is generated by the computer servers.

Figure 2:
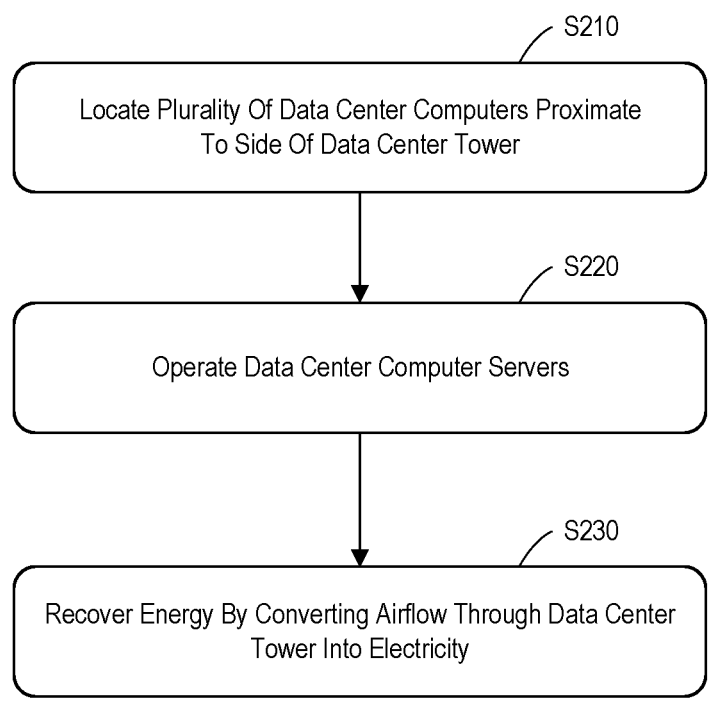
FIG. 2 is a flow diagram of a process to improve heat transfer for a data center in accordance with some embodiments.

FIG. 2 is a flow diagram of a process to improve heat transfer for a data center in accordance with some embodiments. At 5210, a plurality of data center computers are located proximate to a side of a data center tower that is structured and/or shaped in accordance with any of the embodiments described herein. At 5220, the data center computer servers are operated, and, according to some embodiments, energy may be recovered by converting airflow through the data center tower into electricity (e.g., as described in connection with FIG. 8).

Figure 3:
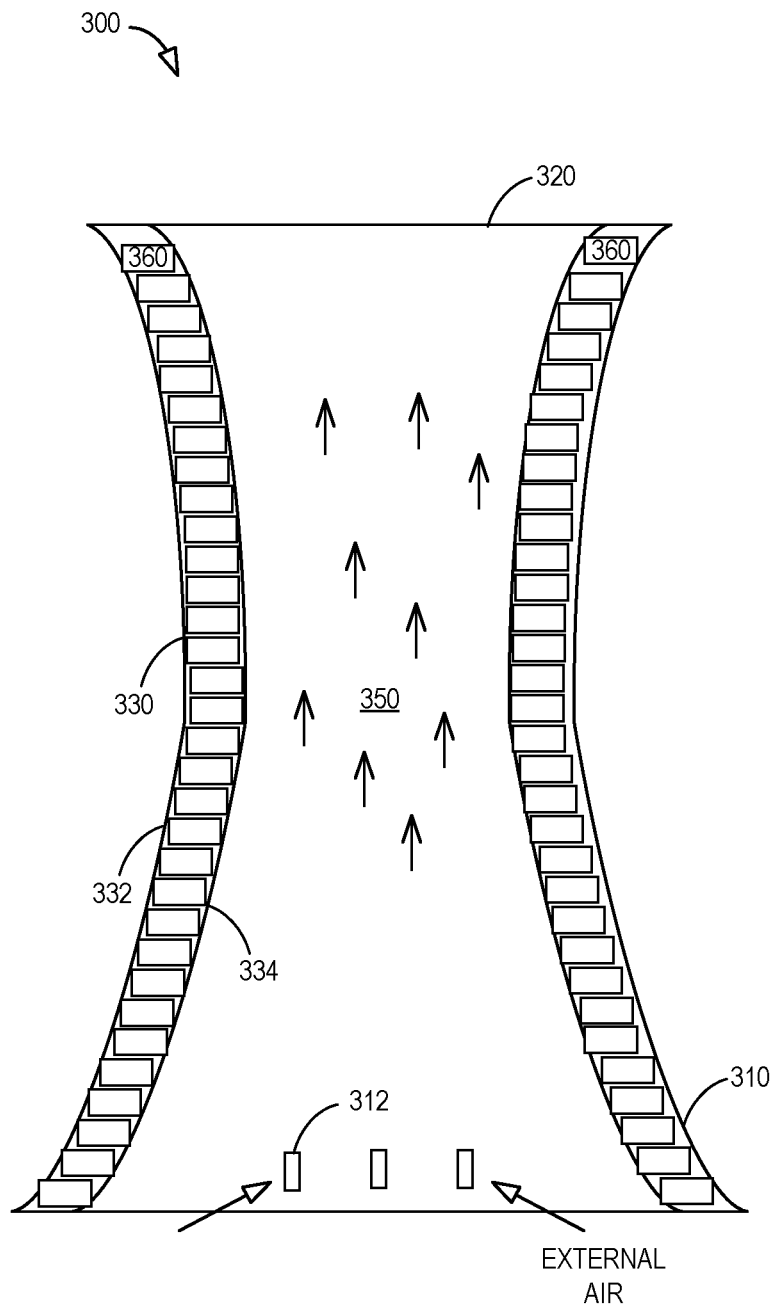
FIG. 3 is a side plan view of the cross-section 3-3 illustrated in FIG. 1 according to some embodiments.

FIG. 3 is a side plan view 300 of the cross-section 3-3 illustrated in FIG. 1 according to some embodiments. The view 300 includes a substantially cylindrical data center tower, generally shaped like a tube having an interior portion 350. The tower includes a data center tower bottom 310 having at least one bottom opening 312 to receive external air. The tower also includes a data center tower top 320, smaller than the data center tower bottom 110, having a top opening to expel air containing heat, created by computer servers 360 located in the wall of the data center tower. According to some embodiments, a side 330 of the data center tower includes an inner surface 334 and an outer surface 332 or membrane. According to some embodiments, a plurality of hydrophilic bladders are proximate to the outer surface 332. According to other embodiments, the plurality of hydrophilic bladders are proximate to the inner surface 334. According to still other embodiments, the plurality of hydrophilic bladders are proximate to both the outer and inner surfaces or membranes.

Figure 4:
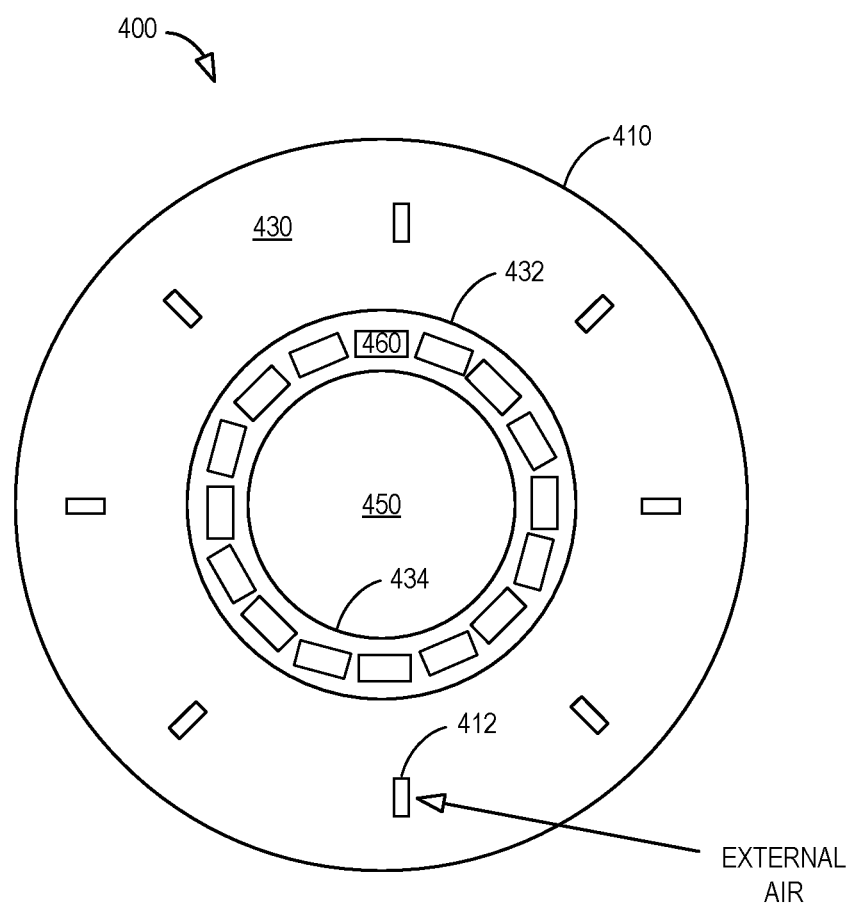
FIG. 4 is a top plan view of the cross-section 3-3 illustrated in FIG. 1 in accordance with some embodiments.

FIG. 4 is a top plan view 400 of the cross-section 3-3 illustrated in FIG. 1 in accordance with some embodiments. The view 400 includes a substantially cylindrical data center tower, generally shaped like a tube having an interior portion 450. The tower includes a data center tower bottom 410 having at least one bottom opening 412 to receive external air. The tower also includes a data center tower top, smaller than the data center tower bottom 410, having a top opening to expel air containing heat, created by computer servers 460 located in the wall of the data center tower.

Figure 5:
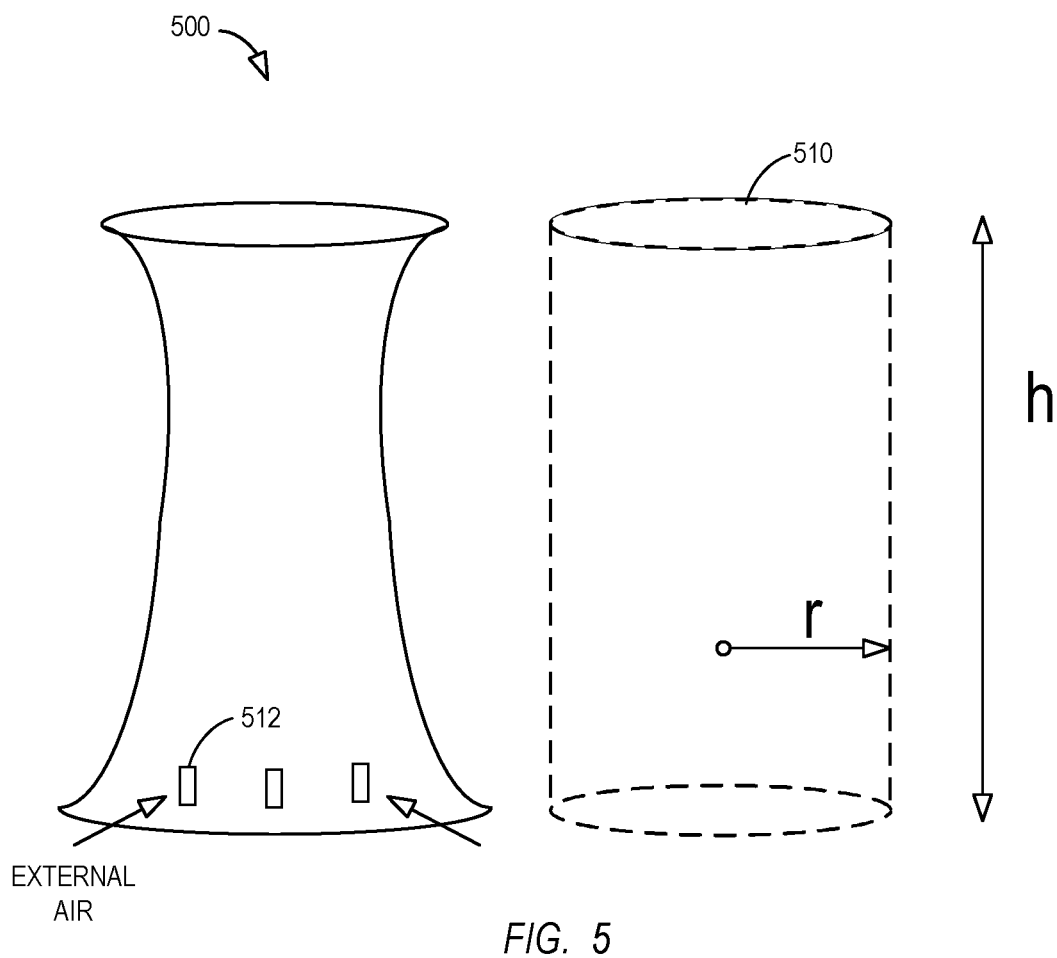
FIG. 5 illustrates a data center tower approximation according to some embodiments.

FIG. 5 illustrates a data center tower approximation 500 according to some embodiments. In particular, a cylinder 510 having at least one bottom opening 512, a radius of r, and a height of h may be used to approximate the data center tower. Consider, for example, a typical full-size data center computer server rack having a height of 6 feet. The surface area of the sides of the cylinder 510 can be described as:

$$A_{side} = 2\pi rh$$

Moreover, the surface area of the top and bottom of the cylinder 510 can be described as:

$$A_{top\ and\ bottom} = \pi r^2$$

Combining these equations, the total surface area of the cylinder 510 may be described as:

$$A_{total} = 2\pi rh + \pi r^2 = 2\pi r(r+h)$$

Thus, for a data center tower with a radius r of 1,000 feet and a height h of 500 feet, a total surface area associated with computer server racks (which have two sides and thus double the $A_{total}$ calculation described above) can be calculated to be approximately 9,420,000 square feet.

Figure 6:
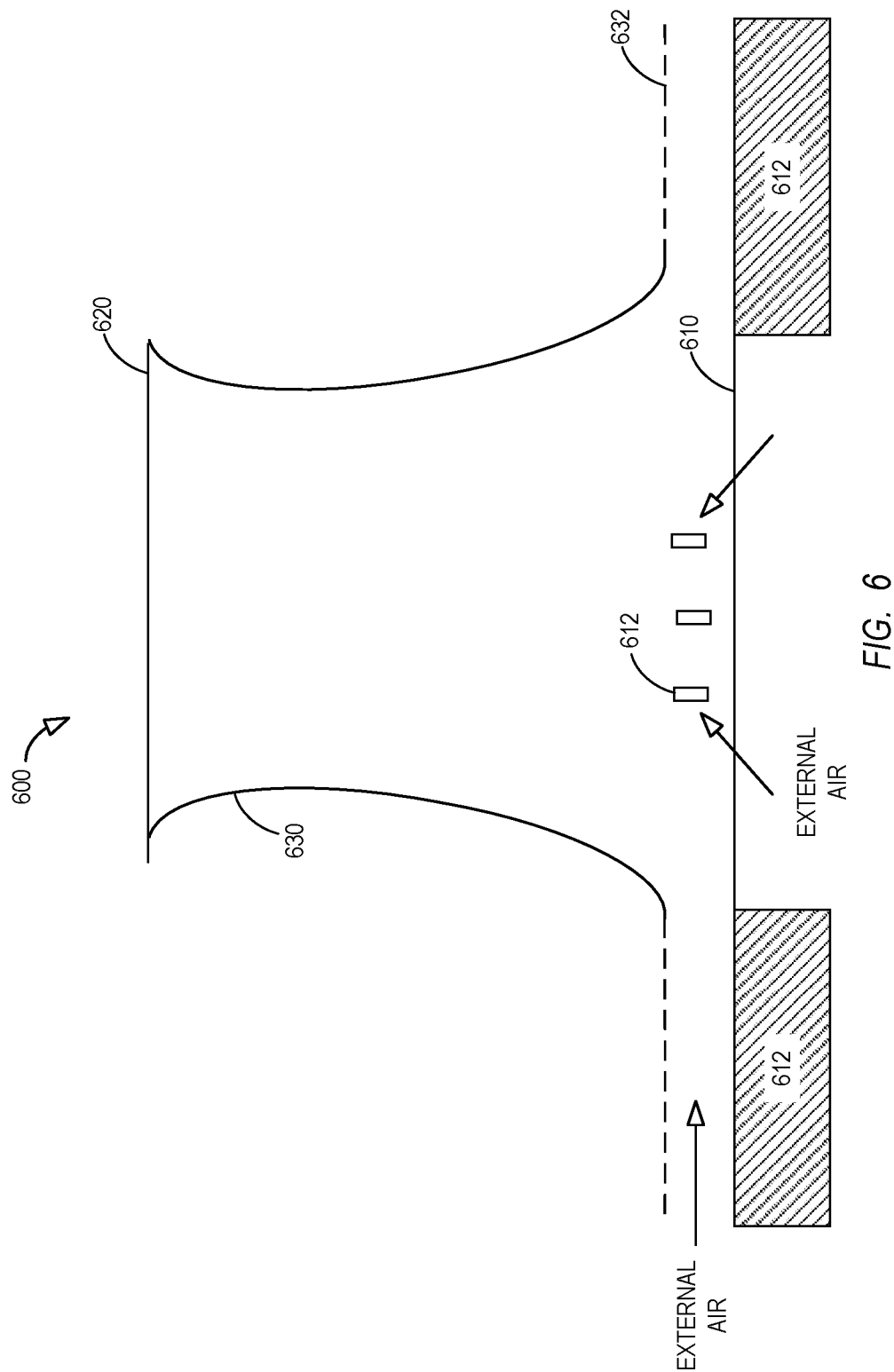
FIG. 6 is a high-level block diagram of a system in accordance with some embodiments.

FIG. 6 is a high-level block diagram of a system 600 in accordance with some embodiments. As before, the system 600 includes a substantially cylindrical data center tower, generally shaped like a tube. The tower includes a data center tower bottom 610 having at least one bottom opening 612 to receive external air. The tower also includes a data center tower top 620, smaller than the data center tower bottom 610, having a top opening to expel air containing heat, created by the data center (either via the Venturi effect or any other mechanism) and a plurality of hydrophilic bladders may be located proximate to at least a portion of a side 130 of the data center tower. According to some embodiments, a heat capturing bottom portion 632 of the side 630 of the data center tower is formed of transparent material and/or translucent materials (as illustrated by dashed lines in FIG. 6). In this way, Ultra Violet ("UV") can pass through the heat capturing bottom portion 632. Moreover, a heat absorbing substance 612 may be positioned below the heat capturing bottom portion 632 of the side 630 of the data center tower. The heat absorbing substance might be associated with, for example, sand, rock, soil, etc. As a result, ground under the UV light material can be trapped and released slowly over the course of the day and into the night. This heat may further encourage upward vertical airflow through the tower.

Figure 7:
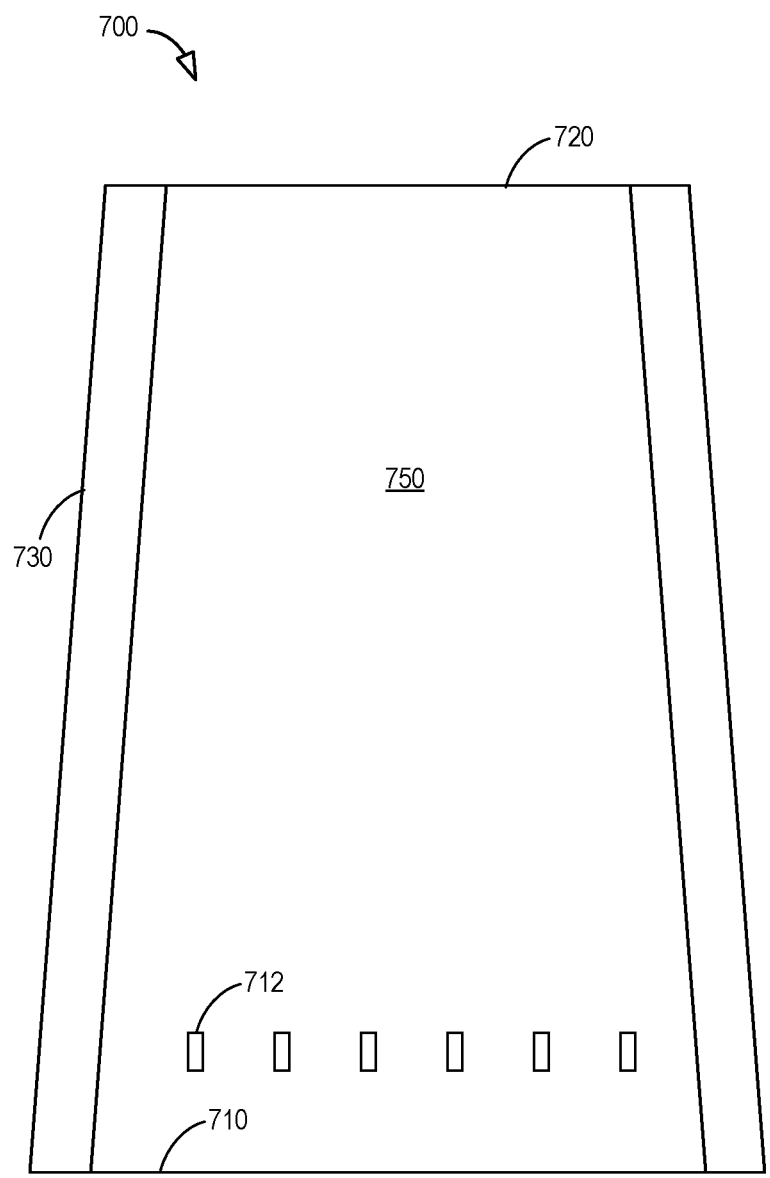
FIG. 7 illustrates a data center tower according to another embodiment.

The examples described in connections with FIGS. 1 and 6 had curved tower sides. Note, however, that some embodiments may have other configurations. For example, FIG. 7 illustrates a data center tower 700 according to another embodiment. In this case, a linear side wall 730 housing computer servers and forming an interior 750 to encourage upward vertical airflow may be provided between a bottom 710 (having at least one bottom opening 712) and a top 720 portion of the data center tower.

Figure 8:
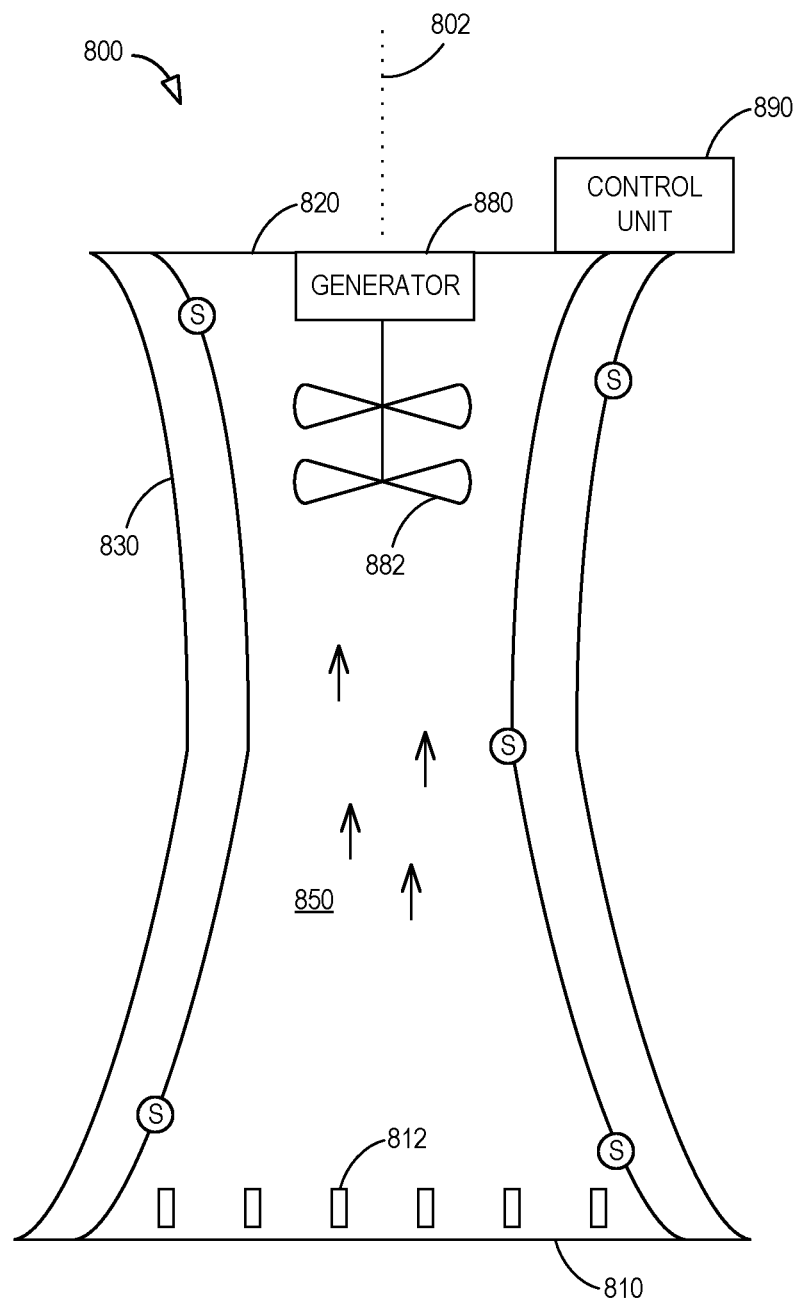
FIG. 8 is a data center tower that recovers energy from the heat generated by computer servers in accordance with some embodiments.

FIG. 8 is a data center tower 800 that recovers energy from the heat generated by computer servers in accordance with some embodiments. As in the other examples, the system 800 includes a substantially cylindrical data center tower, generally shaped like a tube. The tower includes a data center tower bottom 810 having at least one bottom opening to receive external air. The tower also includes a data center tower top 820, smaller than the data center tower bottom 810 (with at least one bottom opening 812), having a top opening to expel air containing heat, created by the data center (either via the Venturi effect or any other mechanism) and a plurality of hydrophilic bladders may be located proximate to at least a portion of a side 830 of the data center tower. As computer servers in the side wall 830 of the tower generate heat, the warm air will rise in the interior portion 850 of the data center tower (which has a vertical axis 802). To capture or recover this energy, at least one turbine blade 882 may be located within the interior 850 of the data center tower and oriented to rotate about the vertical axis 802 as heated air travels up through the data center tower. A generator 880 may be coupled to the at least one turbine blade 882 to generate electricity. According to some embodiments, a plurality of temperature and/or airflow sensors (illustrated with an "S" in FIG. 8) may be located proximate to the data center tower. A control unit 890 computer may then receive data from the plurality of temperature sensor and, based on the received data, control operation of the generator 880.

Figure 9:
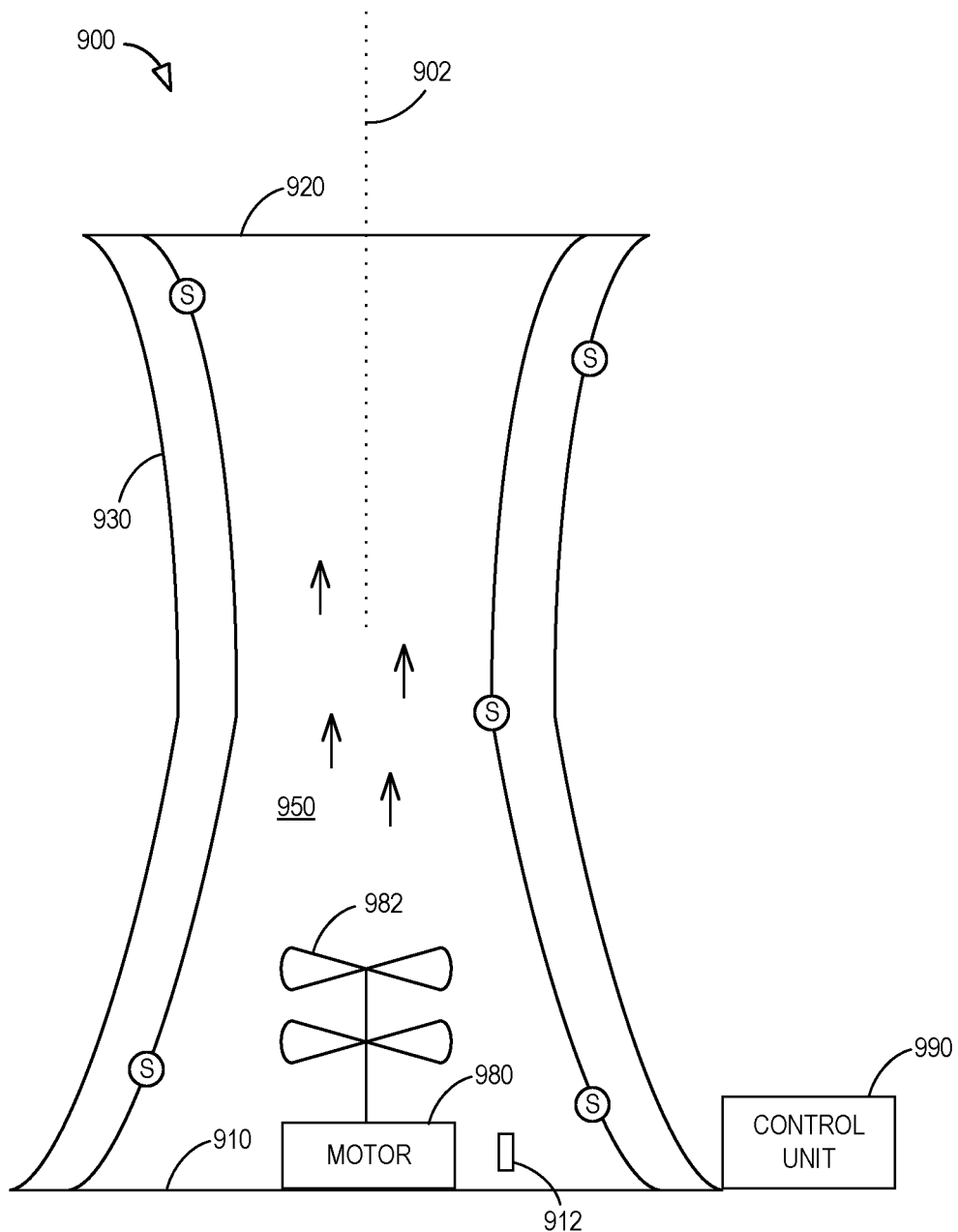
FIG. 9 is a data center tower that encourages upward, vertical airflow according to some embodiments.

FIG. 9 is a data center tower 900 that encourages upward, vertical airflow according to some embodiments. As in the other examples, the system 900 includes a substantially cylindrical data center tower, generally shaped like a tube. The tower includes a data center tower bottom 910 having at least one bottom opening 912 to receive external air. The tower also includes a data center tower top 920, smaller than the data center tower bottom 910, having a top opening to expel air containing heat, created by the data center (either via the Venturi effect or any other mechanism) and a plurality of hydrophilic bladders may be located proximate to at least a portion of a side 930 of the data center tower. As computer servers in the side wall 930 of the tower generate heat, the warm air will rise in the interior portion 950 of the data center tower (which has a vertical axis 902). To help encourage airflow, at least one turbine blade 982 may be located within the interior 950 of the data center tower and oriented to rotate about the vertical axis 902. A motor 980 may be coupled to the at least one turbine blade 982 to rotate the blade(s) 982 and push air upward. According to some embodiments, a plurality of temperature and/or airflow sensors (illustrated with an "S" in FIG. 9) may be located proximate to the data center tower. A control unit 990 computer may then receive data from the plurality of temperature sensor and, based on the received data, control operation of the motor 980.

Figure 10:
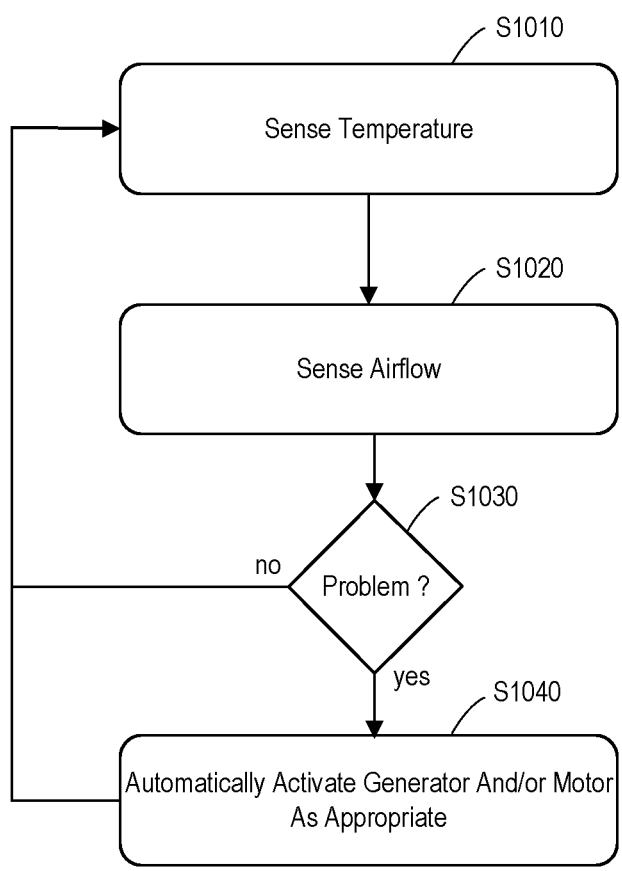
FIG. 10 is a control unit method in accordance with some embodiments.

The control units 890, 990 of FIGS. 8 and 9 respectively might, according to some embodiments, automatically perform temperate sensing (is the temperature too low or too high?), airflow sensing (how fast in the air moving?), temperature control (to increase or decrease the temperature), and/or airflow control (to adjust the speed). For example, FIG. 10 is a control unit method in accordance with some embodiments. At S1010, the control unit senses temperature (e.g., internal and/or external temperatures measured in degrees). At S1020, the control unit might sense airflow (e.g., measured in miles-per-hour). If no problem is detected at S1030, the process continues at S1010. If a problem is detected at S1030, the control unit may "automatically" correct the operation of a generator and/or motor as appropriate at S1040. As used herein, the term "automatically" may refer to actions taken with little or no human intervention.

Figure 11:
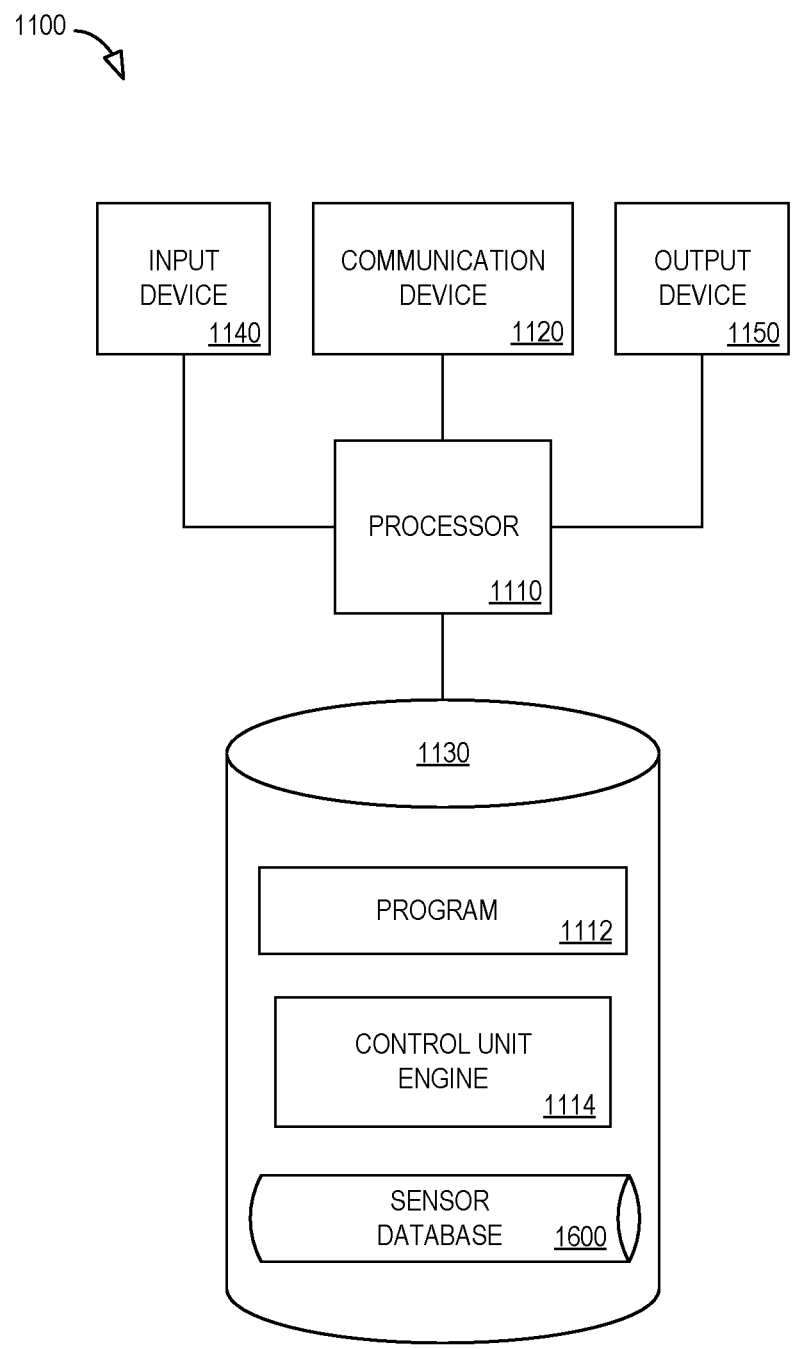
FIG. 11 illustrates a control unit apparatus according to some embodiments.

The embodiments described herein may be implemented using any number of different hardware configurations. For example, FIG. 11 is a block diagram of a control unit apparatus or platform 1100 that may be, for example, associated with the systems 800, 900 of FIGS. 8 and 9, respectively, or any other system described herein. The control unit 1100 comprises a processor 1110, such as one or more commercially available Central Processing Units ("CPUs") in the form of one-chip microprocessors, coupled to a communication device 1160 configured to communicate via a communication network (not shown in FIG. 11). The communication device 1160 may be used to communicate, for example, with one or more remote temperature sensors, airflow sensors, etc. The control unit 1100 further includes an input device 1140 (e.g., a computer mouse and/or keyboard to input data center information) and/an output device 1150 (e.g., a computer monitor to render a display, provide alerts, transmit recommendations, and/or create reports). According to some embodiments, a mobile device, monitoring physical system, and/or PC may be used by an operator to exchange information with the control unit 1100.

The processor 1110 also communicates with a storage device 1130. The storage device 1130 may comprise any appropriate information storage device, including combinations of magnetic storage devices (e.g., a hard disk drive), optical storage devices, mobile telephones, and/or semiconductor memory devices. The storage device 1130 stores a program 1116 and/or a control unit engine 1114 for controlling the processor 1110. The processor 1110 performs instructions of the programs 1116, 1114, and thereby operates in accordance with any of the embodiments described herein. For example, the processor 1110 may automatically perform temperature and/or airflow monitoring to control the operation of a data center tower. According to some embodiments, information about the operation of the data center tower (e.g., how much information is currently being processed?) might also be used by the processor 1110.

The programs 1116, 1114 may be stored in a compressed, uncompiled and/or encrypted format. The programs 1116, 1114 may furthermore include other program elements, such as an operating system, clipboard application, a database management system, and/or device drivers used by the processor 1110 to interface with peripheral devices.

As used herein, information may be "received" by or "transmitted" to, for example: (i) the control unit 1100 from another device; or (ii) a software application or module within the control unit 1100 from another software application, module, or any other source.

In some embodiments (such as the one shown in FIG. 11), the storage device 1130 further stores a sensor database 1200. An example of a database that may be used in connection with the control unit 1100 will now be described in detail with respect to FIG. 12. Note that the database described herein is only one example, and additional and/or different information may be stored therein. Moreover, various databases might be split or combined in accordance with any of the embodiments described herein.

Figure 12:
FIG. 12 is tabular portion of a sensor database in accordance with some embodiments.

Referring to FIG. 12, a table is shown that represents the sensor database 1200 that may be stored at the control unit 1100 according to some embodiments. The table may include, for example, entries identifying data sensors being monitored. The table may also define fields 1202, 1204, 1206, 1208, 1210 for each of the entries. The fields 1202, 1204, 1206, 1208, 1210 may, according to some embodiments, specify: a sensor identifier 1202, a temperature 1204, an airflow 1206, a generator status 1208, and a motor status 1210. The sensor database 1200 may be created and updated, for example, based on information periodically received from one or more wireless and/or remote temperature sensors, airflow sensors, etc.

The sensor identifier 1202 might be a unique alphanumeric code associated with a particular sensor at a data center tower. The temperature 1204 and airflow 1206 may reflect current conditions inside the data center tower. The generator status 1208 might indicate whether or not the generator has been turned on (e.g., along with how much energy the generator is currently capturing). The motor status 1210 might indicate whether or not the motor has been turned on (and a motor speed). For example, when the temperature 1204 rises above a pre-determined threshold value or the airflow 1208 falls below a pre-determined threshold value, the motor may be turned on to improve airflow (and eventually lower the temperature).

Figure 13:
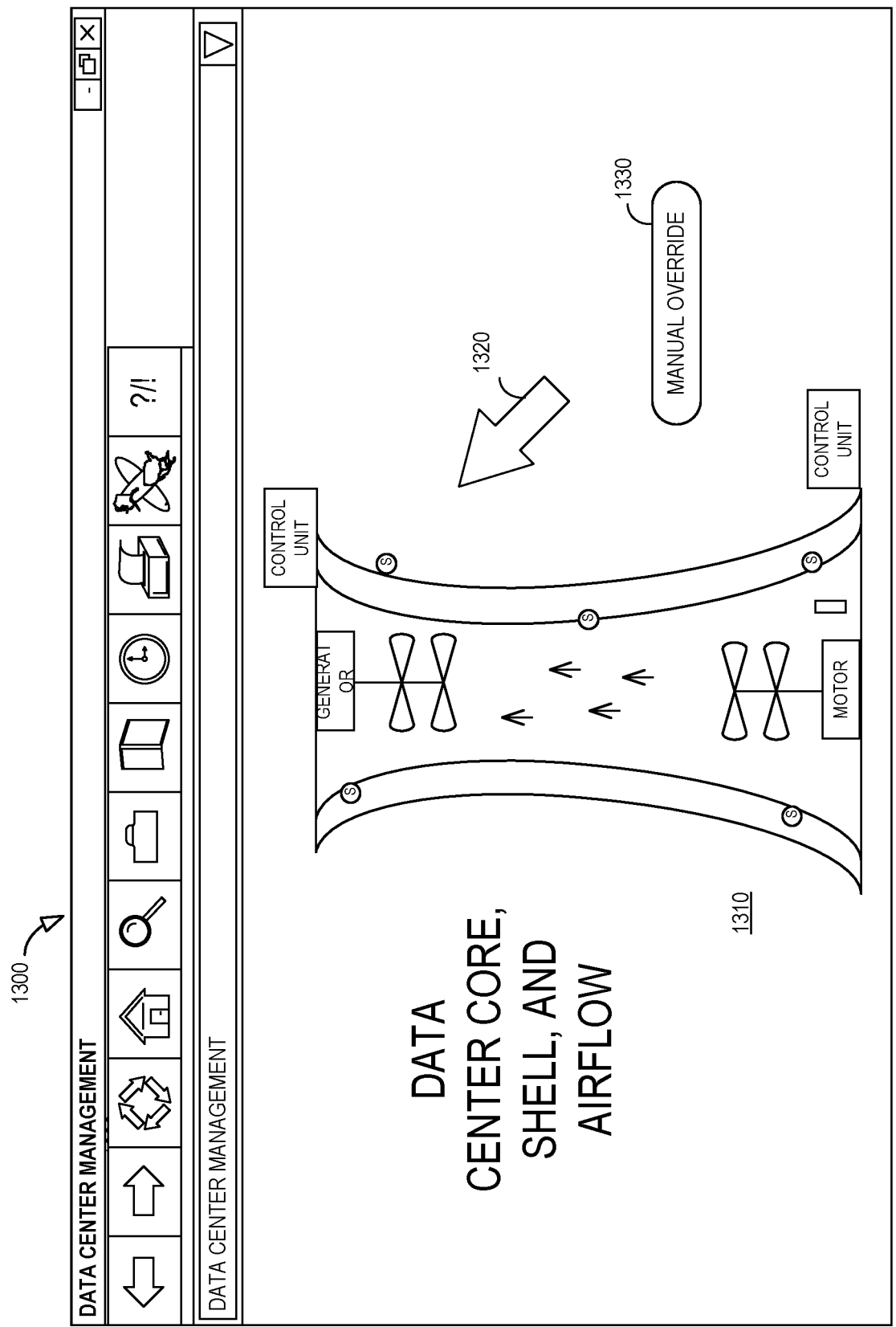
FIG. 13 is an example of a data center core, shell, and airflow display according to some embodiments.

An operator might manage and/or monitor the performance of a data center tower. For example, FIG. 13 is an example of a data center core, shell, and airflow display 1300 according to some embodiments. The display 1300 includes graphical depictions 1310 of elements of a data center tower. According to some embodiments, selection of an element via a touchscreen or computer mouse pointer 1320 may result in addition information being provided about that element (e.g., in a pop-up window) and/or let an operator adjust parameters for that element. Moreover, in some embodiments, selection of a "Manual Override" icon 1330 may let an operator shutdown or otherwise alter the automatic determination of a control unit.

Thus, embodiments may provide systems and methods to efficiently improve data center cooling without the need of expensive additional hardware (such as those associated with a liquid cooling system). Note that higher power servers may demand greater cooling capacity as compared to what can be provided economically by simple air based cooling with fans and heat sinks. Some embodiments described herein may address that problem by designing a data center tower that encourages an intake of cool air and the expulsion of air that contains heat from data center servers. Such an approach may improve heat transfer and improve efficiency in a novel way.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions.

Embodiments described herein are solely for the purpose of illustration. Those in the art will recognize other embodiments may be practiced with modifications and alterations to that described above.

What is claimed is:

1. A system to improve heat transfer for a data center, comprising:
    a substantially cylindrical data center tower, including:
        a data center tower bottom having at least one bottom opening to receive external air,
        a data center tower top, smaller than the data center tower bottom, having a top opening to expel air containing heat, created by the data center, via the Venturi effect, and
        a plurality of hydrophilic bladders proximate to at least a portion of a side of the data center tower; and
    a plurality of data center computer servers arranged proximate to the side of the data center tower.

2. The system of claim 1, wherein the side of the data center tower is associated with a concave curve such that the data center tower has a substantially hyperboloid shape.

3. The system of claim 1, wherein the plurality of hydrophilic bladders are arranged in at least one of: (i) a substantially lattice pattern, (ii) a substantially spiderweb pattern, and (iii) a substantially isometric pattern.

4. The system of claim 1, wherein a heat capturing bottom portion of the side of the data center tower is formed of at least one of: (i) a transparent material, and (ii) a translucent material.

5. The system of claim 4, wherein a heat absorbing substance is positioned below the heat capturing bottom portion of the side of the data center tower.

6. The system of claim 5, wherein the heat absorbing substance includes at least one of: (i) sand, (ii) rock, and (iii) soil.

7. The system of claim 1, wherein the side of the data center tower includes an inner surface and an outer surface, and the plurality of hydrophilic bladders are proximate to the outer surface.

8. The system of claim 1, wherein the side of the data center tower includes an inner surface and an outer surface, and the plurality of hydrophilic bladders are proximate to the inner surface.

9. The system of claim 1, wherein the side of the data center tower includes an inner surface and an outer surface, and the plurality of hydrophilic bladders are proximate to both the outer and inner surfaces.

10. The system of claim 1, wherein the data center tower has a vertical axis and further comprising:
    at least one turbine blade located within an interior of the data center tower and oriented to rotate about the vertical axis as heated air travels up through the data center tower; and
    a generator coupled to the at least one turbine blade to generate electricity.

11. The system of claim 10, further comprising:
    a plurality of temperature sensors located proximate to the data center tower; and
    a control unit computer to receive data from the plurality of temperature sensor and, based on the received data, control operation of the generator.

12. The system of claim 1, wherein the data center tower has a vertical axis and further comprising:
    at least one turbine blade located within an interior of the data center tower and oriented to rotate about the vertical axis to move air up through the data center tower; and
    a motor coupled to the at least one turbine blade.

13. The system of claim 12, further comprising:
    a plurality of temperature sensors located proximate to the data center tower; and
    a control unit computer to receive data from the plurality of temperature sensor and, based on the received data, control operation of the motor.

14. A method to improve heat transfer for a data center, comprising:
    operating a plurality of data center computer servers arranged proximate to the side of a data center tower, the data center tower being substantially cylindrical and including:
        a data center tower bottom having at least one bottom opening to receive external air,
        a data center tower top, smaller than the data center tower bottom, having a top opening to expel air containing heat, created by the data center, via the Venturi effect, and
        a plurality of hydrophilic bladders proximate to at least a portion of a side of the data center tower.

15. The method of claim 14 wherein the data center tower has a vertical axis and further comprising:
    receiving data from a plurality of temperature sensors located proximate to the data center tower; and
    controlling, by a control unit computer based on the received data, at least one of a generator and a motor coupled to at least one turbine blade located within an interior of the data center tower and oriented to rotate about the vertical axis.

16. The method of claim 14, wherein the side of the data center tower is associated with a concave curve such that the data center tower has a substantially hyperboloid shape.

17. The method of claim 14, wherein the plurality of hydrophilic bladders are arranged in at least one of: (i) a substantially lattice pattern, (ii) a substantially spiderweb pattern, and (iii) a substantially isometric pattern.

18. The method of claim 14, wherein a heat capturing bottom portion of the side of the data center tower is formed of at least one of: (i) a transparent material, and (ii) a translucent material.

19. The method of claim 18, wherein a heat absorbing substance is positioned below the heat capturing bottom portion of the side of the data center tower.

20. The method of claim 19, wherein the heat absorbing substance includes at least one of: (i) sand, (ii) rock, and (iii) soil.

* * * * *